United States Patent [19]
Nishimura et al.

[11] Patent Number: 5,147,493
[45] Date of Patent: Sep. 15, 1992

[54] PLASMA GENERATING APPARATUS

[75] Inventors: Eiichi Nishimura; Akihito Toda, both of Yamanashi; Kazuhiko Sugiyama, Hachioji; Yukio Naitou, Kofu, all of Japan

[73] Assignees: Tokyo Electron Limited, Tokyo; Tokyo Electron Yamanashi Limited, Nirasaki, both of Japan

[21] Appl. No.: 714,231

[22] Filed: Jun. 12, 1991

[30] Foreign Application Priority Data

Jun. 15, 1990 [JP] Japan ................................ 2-15676

[51] Int. Cl.⁵ .............................................. H01L 21/00
[52] U.S. Cl. .................................... 156/345; 118/723; 315/111.51; 204/298.06; 204/298.34
[58] Field of Search ..................... 156/345; 118/723; 204/298.02, 298.31, 298.06, 298.34; 315/276, 277, 111.51

[56] References Cited

U.S. PATENT DOCUMENTS

| | | | |
|---|---|---|---|
| 2,457,663 | 12/1948 | Hanchett et al. | 315/276 |
| 2,637,018 | 8/1953 | Hertog | 3115/276 |
| 4,144,477 | 3/1979 | Eaton | 315/276 |
| 4,222,838 | 9/1980 | Bhagat et al. | 204/192.32 |
| 4,617,079 | 10/1986 | Tracy et al. | 156/643 |
| 4,626,312 | 12/1986 | Tracy | 156/345 |
| 4,846,920 | 7/1989 | Keller et al. | 204/298 |
| 4,871,421 | 10/1989 | Ogle et al. | 204/192.32 |
| 4,931,135 | 6/1990 | Horiuchi et al. | 156/345 |

Primary Examiner—David A. Simmons
Assistant Examiner—George Goudreau
Attorney, Agent, or Firm—Oblon, Spivak, McClelland, Maier & Neustadt

[57] ABSTRACT

A plasma generating apparatus comprising a transformer including a primary winding connected to a high frequency power source and a secondary winding having two end terminals and a plurality of tap terminals connected between the end terminals, the transformer being adapted to deliver first and second high frequency electric powers with a phase difference of 180° from the end terminals, upper and lower electrodes disposed in a vacuum chamber so as to be opposed at a distance from each other and supplied with the first and second high frequency powers, respectively, and a power ratio selector for switching the tap terminals to select the ratio between the first and second high frequency powers supplied to the electrodes, wherein a to-be-processed object placed on the lower electrode is processed by means of plasma formed between the electrodes.

9 Claims, 5 Drawing Sheets

| Press. T/B | 0.2 T | 0.3 | 0.4 | 0.5 |
|---|---|---|---|---|
| 100/ 0 | REFLECTION WAVE IS LARGE ||||
| 90/ 10 | UNIFORM PLASMA REGION ||||
| 80/ 20 | ||||
| 70/ 30 | ||||
| 60/ 40 | ||||
| 50/ 50 | ||||

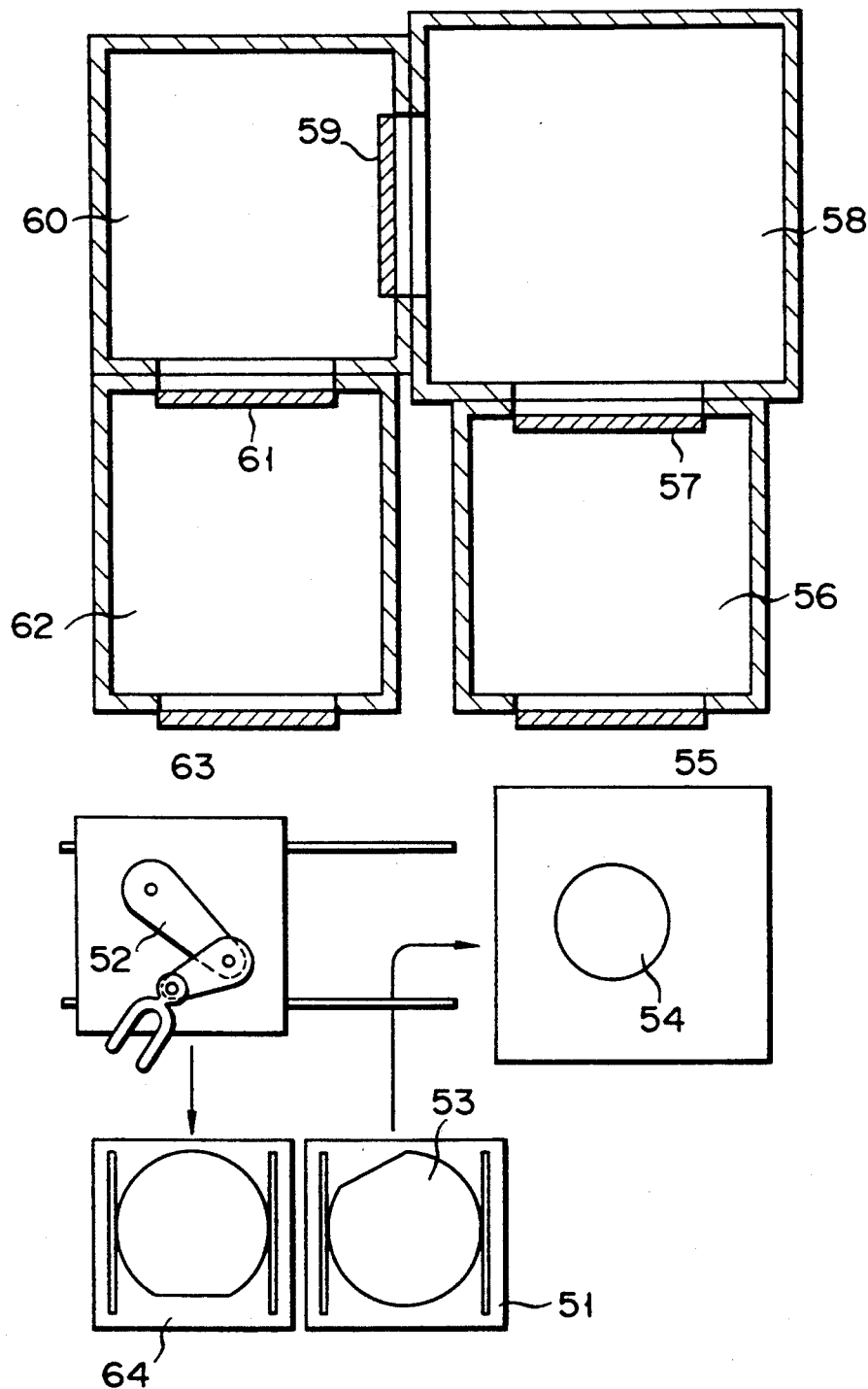
F I G. 6

PLASMA GENERATING APPARATUS

BACKGROUND OF THE INVENTION

1. Field of the Invention

The present invention relates to a plasma apparatus, and more particularly, to a plasma generating apparatus used as a plasma etching apparatus for a film deposition.

A plasma generating apparatus is used, for example, as a plasma etching apparatus for etching oxide layers in manufacturing semiconductor devices. As modern semiconductor elements become finer, the mask size is reduced in proportion, and the thickness of a to-be-etched layer, that is, oxide layer on a step portion, increases and the groove becomes thinner, correspondingly. Thus, the semiconductor devices have a high aspect structure. In this high aspect structure, a reacted gas (reaction product) cannot easily escape from a hole or trench formed in the oxide layer, so that a reaction gas to be supplied next cannot easily enter the hole or trench. In some cases, therefore, the etching rate may lower, or the reaction product may adhere again to the oxide layer thereby preventing the layer from being etched. Such a situation can be avoided to improve the etching rate by only lowering the pressure of a surrounding gas in a chamber, thereby allowing the reaction product to escape easily from the trench. Alternatively, an ion energy required for etching may be controlled by a flow of argon (Ar) gas.

Lowering the surrounding gas pressure in the chamber or controlling the argon gas flow, however, arouses the following problem.

If a high frequency power supply unit is connected to an upper electrode disposed in a grounded vacuum chamber, and if a lower electrode is grounded, for example, the surrounding gas pressure is lowered and the distance between the inner wall of the chamber and the upper or lower electrode becomes relatively shorter than that between the upper and lower electrodes, so that electrons in plasma are liable to move to the inner wall of the chamber as well as to the lower electrode, that is, abnormal electric discharge is easily caused in relation to the inner wall. In case of such abnormal discharge, production of uniform plasma is prevented, and uniformity of semiconductor wafer processing cannot be secured.

A plasma etching system disclosed in U.S. Pat. No. 4,871,421 is one of solutions to the above problem. In this conventional system, a transformer is provided having primary and secondary windings connected electrically to each other. A high frequency power supply unit is connected to the primary winding, two opposite ends of the secondary winding are connected to upper and lower electrodes, respectively, and an intermediate tap of the secondary winding is grounded. When a high frequency electric power is supplied from the high frequency power supply unit to the primary winding, in the apparatus constructed in this manner, high frequency electric powers of equal levels with a phase difference of 180° are delivered from the secondary winding, and are supplied to the upper and lower electrodes, respectively.

According to the conventional plasma etching apparatus described above, the potential difference between the upper and lower electrodes can be made greater than that between each electrode and the inner wall of a chamber, so that electrons in plasma can be restrained from moving to the chamber wall even though the surrounding gas pressure is lowered. Thus, abnormal electric discharge can be prevented, and a uniform plasma condition can be secured between the upper and lower electrodes in the chamber.

In this conventional system, however, the high frequency powers of opposite phases are supplied to the upper and lower electrodes on the same power level, so that a power of a relatively high level is supplied to the lower electrode. As a result, ions act intensively on a semiconductor wafer placed on the lower electrode, thereby damaging the wafer. If the lower electrode is designed so as to be supplied with the high electric power, moreover, the construction of the lower electrode, which requires a cooling structure and a structure for up-and-down motion, will be complicated.

If the electric power supplied to the lower electrode is too low, on the other hand, the plasma condition on the semiconductor wafer is so irregular that the etching rate lowers.

SUMMARY OF THE INVENTION

The object of the present invention is to provide a plasma generating apparatus in which a to-be-processed object, processed by means of plasma, can be prevented from being damaged, and the ratio of electric powers (voltages) supplied individually to upper and lower electrodes can be controlled so as to be able to form uniform plasma.

According to the present invention, there is provided a plasma generating apparatus which comprises a transformer including a primary winding connected to a high frequency power supply unit and a secondary winding having two end terminals and a plurality of tap terminals connected between the end terminals, the transformer being adapted to deliver high frequency electric powers (voltages) with a phase difference of 180°, a pair of electrodes opposed at a distance from each other and supplied individually with the high frequency powers, and a power ratio selector for switching the tap terminals to select the ratio between the high frequency powers supplied to the electrodes, respectively, wherein a to-be-processed object is processed by means of plasma formed between the electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 6 shows the entire structure of a plasma generating apparatus.

DETAILED DESCRIPTION OF THE PREFERRED EMBODIMENTS

Figure 1:
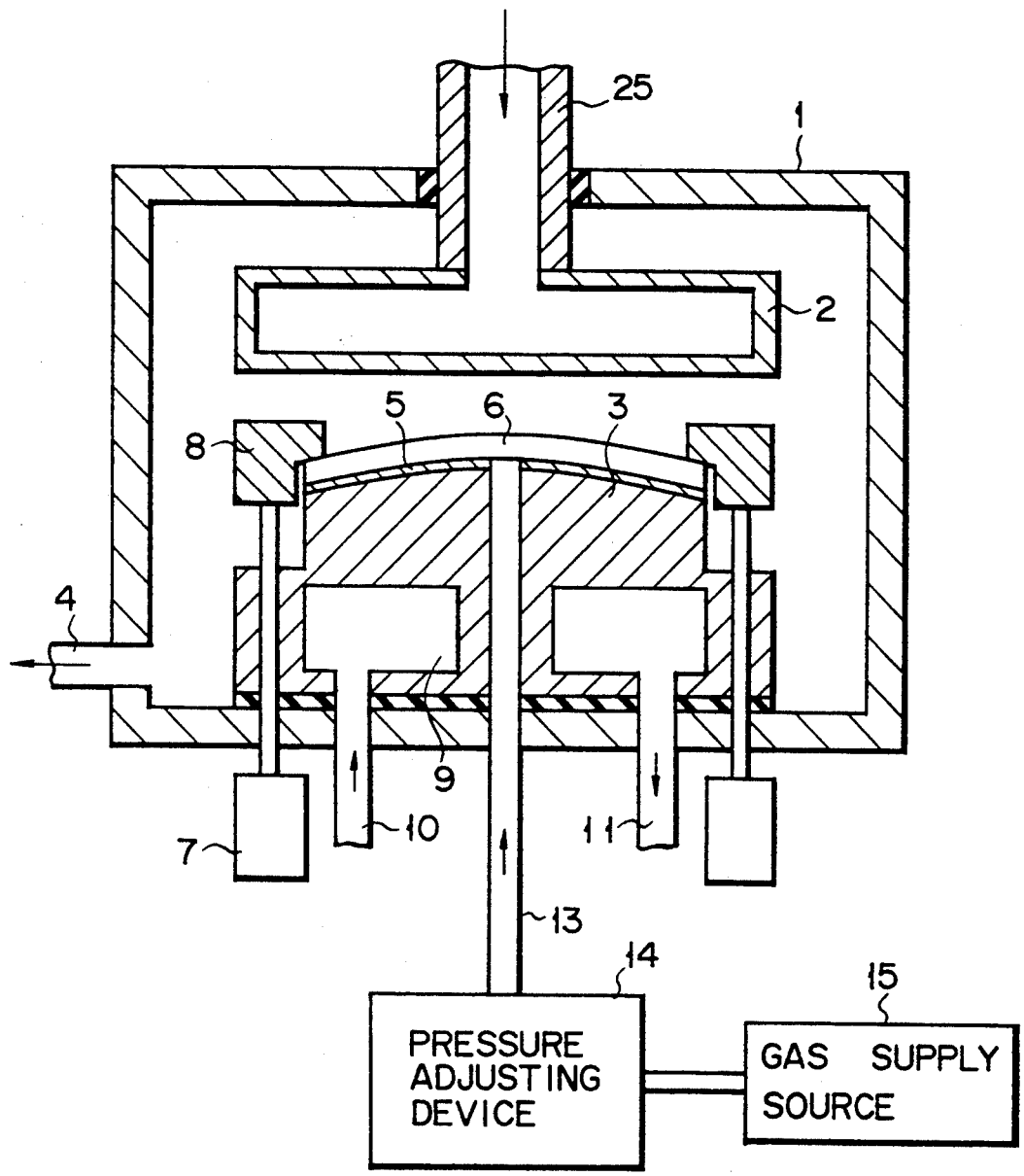
FIG. 1 is a diagram showing an arrangement of a plasma generating unit of a plasma generating apparatus according to an embodiment of the present invention.

Referring to FIG. 1, an arrangement of a plasma generating unit of a plasma generating apparatus according to an embodiment of the present invention will be described.

A sealed chamber or vacuum chamber 1 comprises a metal, for example, aluminum sealed chamber the inner wall of which is subjected to anodizing. The vacuum chamber 1 contains an upper electrode 2 and a lower electrode 3 which, opposed to the upper electrode 2 at a distance therefrom, doubles as a support for carrying a to-be-processed object thereon. The inside of the vacuum chamber 1 is connected with an exhaust system 4 such as dry pump, turbo-molecular pump and oil pump, which can exhaust the chamber 1 selectively to a predetermined degree of vacuum, e.g., several mTorr to several tens of mTorr.

The upper electrode 2 is connected to a reaction gas supply pipe 25 the surface of which is subjected to anodizing using electric conductive material such as aluminum, and a plurality of fine pores (not shown) are formed in the surface of the lower portion of the electrode 2. Reaction gas, such as argon gas, is fed into the vacuum chamber 1 through the pores.

An insulation elastic film 5 of 20 to 90 μm thick, preferably about 25 μm thick is pasted on the upper surface of the lower electrode 3 by means of, e.g., an acrylic resin adhesive of 10 to 50 μm thick. The to-be-processed object, such as a semiconductor wafer 6, is put on the film 5. The elastic film 5 serves to hold at a constant value the impedance between the wafer 6 and the lower electrode 3. Since the impedance between the wafer 6 and the electrode 3 depends on the distance between the two, if a wafer has a fine deformation and so on, the impedance is not uniform. However, in this embodiment, since the elastic film 5 is sandwiched between the wafer 6 and the lower electrode 3, the impedance therebetween can be made constant by means of the elastic film 5.

The lower electrode 3 is surrounded by a clamp ring 8 which can be lifted by means of a drive mechanism 7, such as an air cylinder, so that the peripheral portion of the wafer 6 is pressed on the lower electrode 3 by the clamp 8. The ring 8 presses the peripheral edge portion of the semiconductor wafer 6 against the elastic film 5, whereby the wafer 6 can be retained on the lower electrode 3 with a predetermined clamp load.

The lower electrode 3 is cooled in order to cool the semiconductor wafer 6, as well as to retain it. Accordingly, a cooling mechanism, for example, a cooling jacket 9 is provided in the lower electrode 3. The jacket 9 is connected with cooling medium inlet and outlet pipes 10 and 11, and a cooling medium, e.g., cooling water, is circulated in the jacket 9 via the pipes 10 and 11, whereby the lower electrode 3 is cooled and thus the semiconductor wafer 6 is cooled by the cooled lower electrode 3.

Microscopic spaces, which are attributable to the roughness of the inner surface of the semiconductor wafer 6, are formed between the elastic film 5 on the upper surface of the lower electrode 3 and the wafer 6. Since these spaces become vacuum and tend to retard heat transfer, a gas inlet pipe 13 is provided penetrating the central portion of the lower electrode 3, whereby a gas (for example, helium gas) for use as a medium to facilitate heat transfer between the electrode 3 and the wafer 6 is introduced into the fine spaces. The pipe 13 is connected to a gas supply source 15 through a pressure adjusting device 14, which is disposed outside the vacuum chamber 1.

Figure 2:
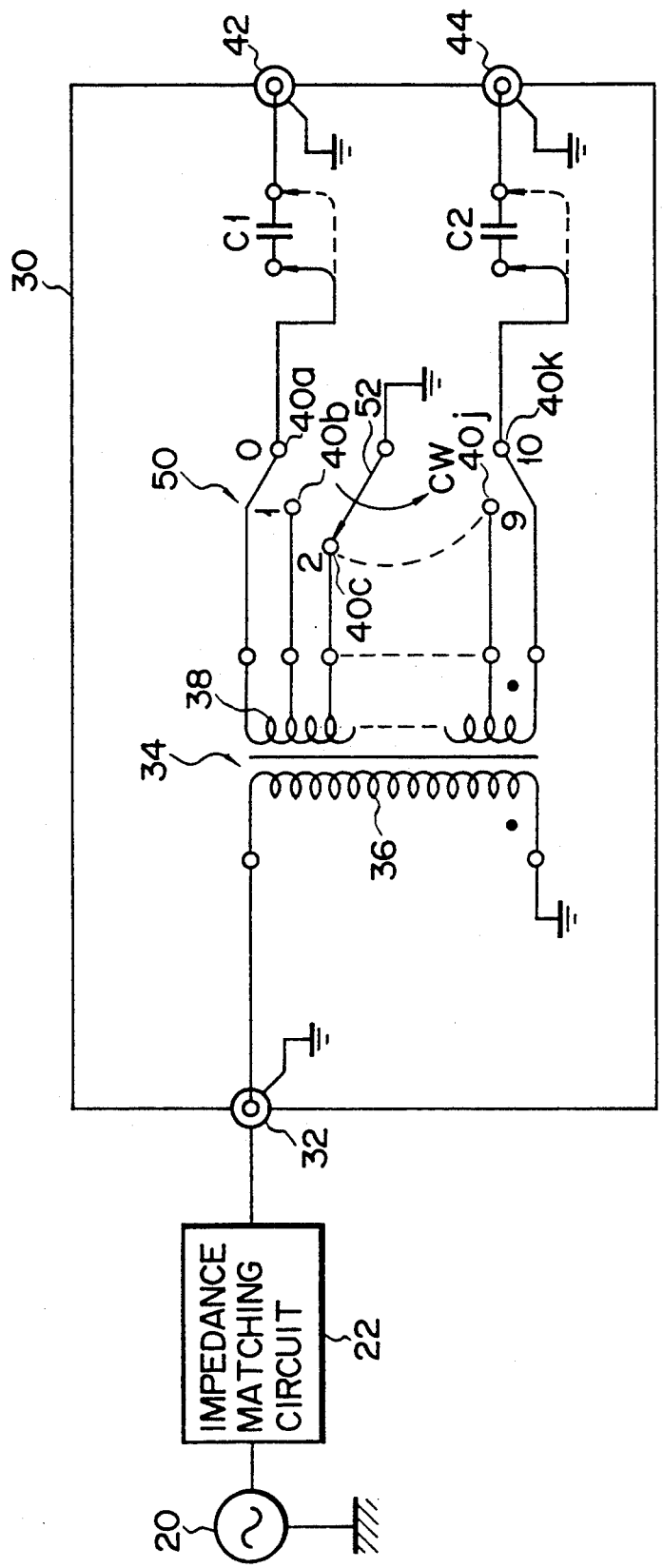
FIG. 2 is a circuit diagram showing a power supply unit of the plasma generating apparatus.

Referring now to FIG. 2, an arrangement of a high frequency power supply unit of the plasma generating apparatus will be described.

One end of a high frequency power supply unit (RF power source) 20 is grounded, while the other end thereof is connected to an input terminal 32 of a power supply circuit 30 through an impedance matching circuit 22. The matching circuit 22 is used to match an output impedance of the power supply circuit 30 to an input impedance to the upper and lower electrodes 2 and 3. The output circuit of the power supply circuit 30 is connected to a transformer 34. The transformer 34 includes a primary winding 36 and a secondary winding 38 insulated from the winding 36. One end of the primary winding 36 is connected to the input terminal 32, and the other end is grounded. A plurality of intermediate tap terminals 40b to 40j are arranged between end terminals 40a and 40k of the secondary winding 38. The end terminals 40a and 40k are connected to output terminals 42 and 44 through capacitors C1 and C2, respectively. The output terminals 42 and 44 are connected to the upper and lower electrodes 2 and 3, respectively.

The intermediate tap terminals 40b to 40j are connected to a power ratio selector 50 so constructed as to be selected by a changeover switch. More specifically, the total number of turns of the secondary winding 38 between the end terminals 40a and 40k are divided into, for example, ten equal parts, and the tap terminals 40b to 40j are connected individually to the resulting divisions. A movable terminal 52, having one end grounded, is brought into contact with any one of the intermediate tap terminals. The secondary winding 38 may be formed of a plurality of coils instead of the intermediate tap terminals, and a slide-type regulator may be attached to the winding 38 so that the intermediate tap position can be continuously varied.

The following is a description of the operation of the plasma etching apparatus constructed in this manner.

After the semiconductor wafer 6 is put on the elastic film 5 of the lower electrode 3 provided within the vacuum chamber 1, the chamber 1 is exhausted to the predetermined degree of vacuum by means of the exhaust system 4. During or after this exhausting the helium gas is supplied between the back surface of the wafer 6 and the elastic film 5 on the lower electrode 3.

After the above preprocess is completed, the reaction gas for etching is fed into the chamber 1 through the upper electrode 2. When the RF power source 20 is turned on, thereafter, high frequency power is supplied to the primary winding 36 via the matching circuit 22 and the input terminal 32. As a result, the high frequency power is led to the secondary winding 38, so that voltages at the end terminals 40a and 40k of the winding 38 are applied to the upper and lower electrodes 2 and 3, respectively. In this case, the high frequency power (broken line a) led to the secondary winding 38 is supplied as a power b to the upper electrode 2 and as a power c to the lower electrode 3. Since the intermediate tap terminal 40c is grounded through the movable terminal 53, the two high frequency powers b and c of different levels are supplied to the upper and lower electrodes 2 and 3, respectively, with a phase difference of 180°. In other words, potential differences between the intermediate tap terminal 40c at zero potential and the end terminals 40a and 40k are applied to the upper and lower electrodes 2 and 3, respectively. Thus, the ratio between the powers supplied to the upper and lower electrodes 2 and 3 can be selected by shifting the movable terminal 52 to any one of the intermediate tap terminals 40b to 40j. The relationships between this ratio and the intermediate tap terminals 40b to 40j selected by the movable terminal 52 can be set in the manner shown in Table 1, for example.

TABLE 1

| Intermediate Tap Terminal | Power Ratio |
|---|---|
| 40a | 0/100 |
| 40b | 10/90 |
| 40c | 20/80 |
| 40d | 30/70 |
| 40e | 40/60 |
| 40g | 60/40 |
| 40h | 70/30 |
| 40i | 80/20 |
| 40j | 90/10 |
| 40k | 100/0 |

Figure 4:
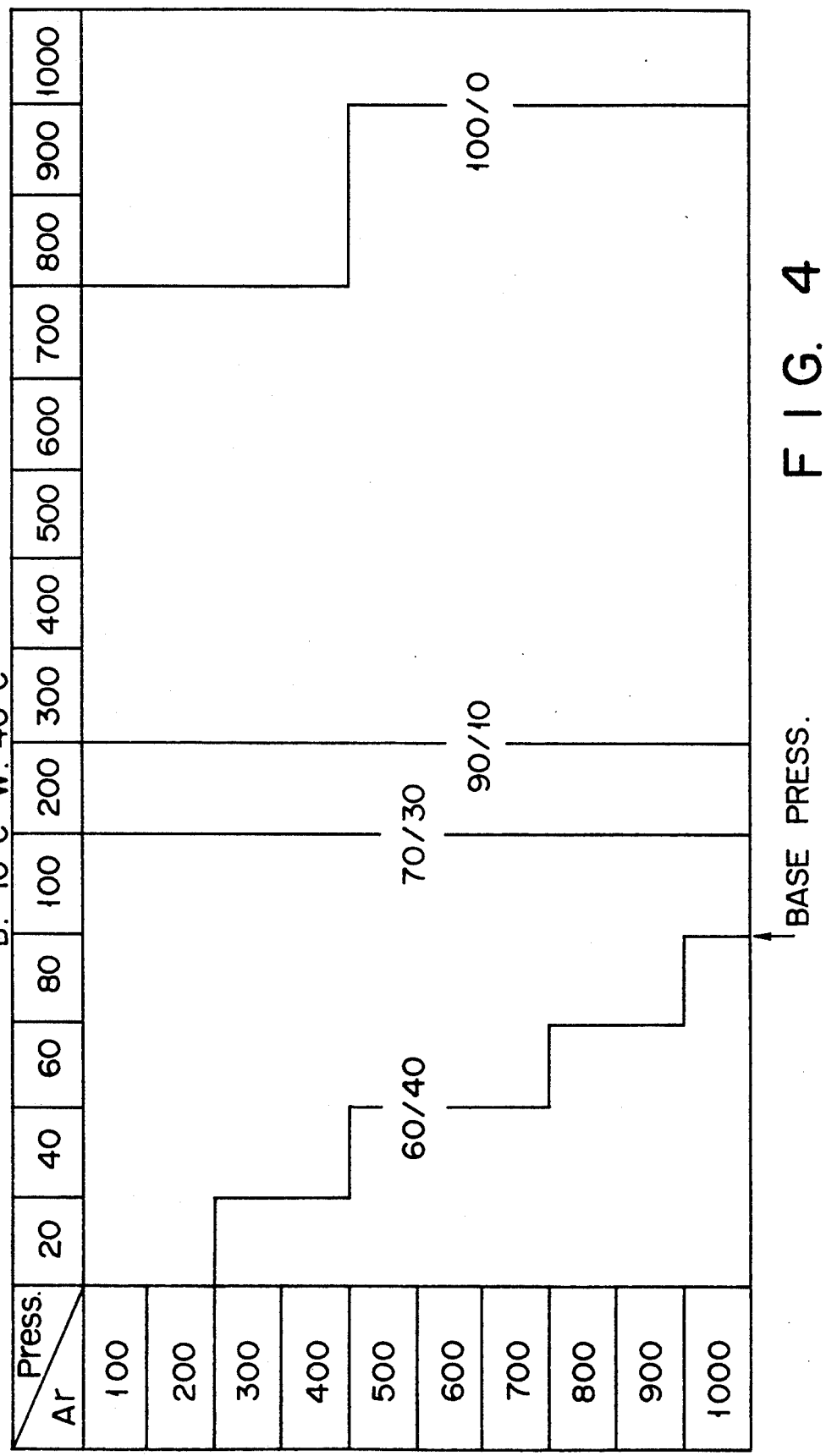

It has been ascertained that a uniform plasma condition can be obtained under any gas pressure by selecting the ratio between the high frequency powers supplied to the upper and lower electrodes 2 and 3, in correspondence with the pressure condition of a surrounding gas in the vacuum chamber 1, as described above. When the plasma processing is preformed in a condition that the pressure of the surrounding gas in the chamber 1 is relatively high, as shown in FIG. 4, the movable terminal 52 is connected to the one end 40k of the secondary winding 38 so that 100% high frequency power is supplied to the upper electrode 2, whereby the uniform plasma condition can be obtained. An experiment has confirmed that the uniform plasma condition can be obtained by setting the power ratio to an optimum value for each surrounding gas pressure, e.g., 90/10 or 70/30, if the gas pressure is lower than in the aforesaid case. This indicates that a uniform plasma condition can be obtained throughout a wide range of gas pressure and a wide range of argon gas flow by selecting the ratio between the high frequency powers supplied to the upper and lower electrodes 2 and 3. In a case of selecting the power ratio, a desired one of the tap terminals 40b to 40j is selected by the movable terminal 52 in correspondence with the surrounding gas pressure in the sealed chamber. This tap terminal selection may be manually or automatically performed. If the movable terminal 52 is not used, a desired one of the tap terminals 40b to 40j may be connected to the grounded terminal corresponding to the movable terminal 52, using a connecting wire.

Figures 3, 5:
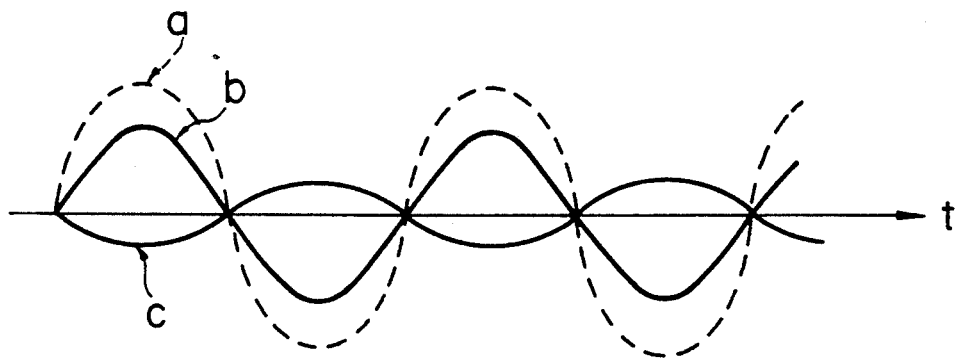
FIG. 3 is a diagram showing waveforms of high frequency electric powers supplied to upper and lower electrodes of the plasma generating apparatus.
FIGS. 4 and 5 are diagrams for illustrating the relationships between gas pressure, high frequency power ratio, and uniform plasma region.

FIG. 5 shows power ratios in which uniform plasma can be formed under the following process conditions.

Process Conditions

Gap: 1.0 cm
Power: 800 W
Ar: 1,000 SCCM (standard CC per minute)
CHF$_3$: 20 SCCM
CF$_4$ 20 SCCM
Clamp: 3 kg/cm$^2$
B.P. (block pressure): 9.0 Torr
He: 10 SCCM
Temperature:
(Top): 20° C.
(Bottom): −10° C.
(Wall): 40° C.

It was able to be confirmed that abnormal electric discharge can be prevented to provide a uniform plasma condition by selecting the power ratio to 90/10 or 80/20 when the pressure of the surrounding gas in the vacuum chamber 1 ranges from 0.2 to 0.5 Torr, as seen from FIG. 5.

In this embodiment, the primary and secondary windings 36 and 38 of the transformer 34 are insulated from each other, the high frequency voltages applied to the opposite electrodes 2 and 3 are applied directly to the primary winding 36. As a result, the high frequency power source 20 can be prevented from being damaged by high frequency voltages applied to the opposite electrodes 2 and 3. Since abnormal electric discharge is prevented by setting the ratio between the high frequency powers supplied to the upper and lower electrodes 2 and 3 to the optimum value, moreover, uniform plasma can be formed between the electrodes eve when the gap between the electrodes is relatively wide.

Since a low-pressure process ca be effectuated by preventing abnormal electric discharge to the side wall of the vacuum chamber 1, furthermore, plasma processing can be executed at a raised etching rate for trench etching.

FIG. 6 shows the entire plasma etching apparatus. One semiconductor wafer 53 is taken out of a sender 51 by means of a handling arm 52, and then is placed on an alignment stage 54. A gate 55 of a load lock chamber (vacuum chamber) 56 located on the inlet side is opened, and the aligned wafer 53 is transferred into the chamber 56, which is then closed. Subsequently, the chamber 6 is evacuated until it has a degree of vacuum identical to that of an etching chamber 58. When the former becomes identical to the latter, a gate 57 is opened, and the wafer 53 is transferred into the etching chamber 58 by means of a handling arm (not shown) provided in the chamber 56.

When etching is finished, a gate 59 is opened in a state where the vacuum degree of the etching chamber 58 is identical to that of a load lock chamber 60 located on the outlet side, and the processed wafer is transferred into the chamber 60 by means of another handling arm (not shown) provided therein.

Thereafter, the vacuum degree of the chamber 60 is made equal to that of a post treatment chamber 62, and then a gate 11 is opened, and the wafer is transferred into the chamber 62. In the chamber 62, if necessary, a post treatment such as light etching or ashing is performed. After the post treatment is completed, a gate 63 is opened, and the wafer is transferred to a receiver 64 by a handling arm 52.

The etching chamber 58 is formed, for example, as shown in FIG. 1, i.e., a cylinder made of aluminum and having an anodized surface.

The present invention is not limited to plasma etching apparatuses, and may be also limited to plasma generating apparatuses such as plasma chemical vapor deposition apparatus and sputtering apparatus, which perform plasma processing by forming plasma between opposite electrodes. Further, the present invention may be applied not only to the plasma processing, but also to ion source, etc.

According to the present invention, as described above, the ratio between the high frequency powers (high frequency voltages) supplied to the opposite electrodes can be controlled depending on the gas pressure in the vacuum chamber, so that a uniform plasma condition can be provided without damaging the wafer as a to-be-processed object. If the power ratio is set so that low power is supplied to the lower electrode, moreover, the construction of the lower electrode, which requires a cooling structure and a structure for up-and-down motion, can be simplified.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma apparatus comprising:
   a transformer including a primary winding connected to a high frequency power source and a secondary winding electrically insulated from said primary winding and having two end terminals and a plurality of tap terminals connected between the end terminals, and intermediate tap means connected to a reference potential point, said transformer being adapted to deliver high frequency electric powers with a phase difference of 180° from the end terminals;
   a sealed chamber;
   first electrode means disposed in said sealed chamber and having a plurality of fine pores through which reaction gas is fed into said sealed chamber;
   second electrode means disposed in said sealed chamber and opposed to said first electrode means at a predetermined distance therefrom, a to-be-processed object being put on said second electrode means;
   gas pipe means provided penetrating said second electrode means for introducing a gas medium for facilitating heat transfer between said second electrode means and said to-be-processed object;
   means for connecting said first and second electrode means to said end terminals of said secondary winding, respectively;
   power splitter means for adjusting the intermediate tap means of the secondary winding to supply to said second electrode means the high frequency power having a power level lower than that supplied to said first electrode means.

2. The plasma apparatus according to claim 1, wherein said intermediate tap means includes a plurality of intermediate tap terminals corresponding to a plurality of predetermined power level ratios, and said power splitter means includes movable switch means for selectively connecting one of the tap terminals to the reference potential point.

3. The plasma apparatus according to claim 1, wherein said first and second electrode means to which the electric powers are supplied at the ratio set by the power splitter means include a first electrode situated at an upper side of said sealed chamber and a second electrode situated at a lower side of said sealed chamber and carrying the to-be-processed object thereon.

4. The plasma apparatus according to claim 3, wherein said power splitter means sets the ratio between the powers supplied tot he first and second electrodes at 7:3.

5. The plasma apparatus according to claim 1, further comprising an impedance matching circuit connected between the high frequency power source and the primary winding of the transformer and adapted to match an output impedance to an input impedance to the pair of electrodes.

6. A plasma apparatus comprising:
   a transformer including a primary winding connected to a high frequency power source and a secondary winding electrically insulated from said primary winding and having two end terminals and a plurality of tap terminals connected between the end terminals, said transformer being adapted to deliver first and second high frequency electric powers with a phase difference of 180° as one of the tap terminals is grounded;
   a sealed chamber;
   an upper electrode disposed on the upper side within the sealed chamber, connected to one of the end terminals of the secondary winding, and supplied with the first high frequency electric power, said upper electrode connected to an external reaction gas source and having a plurality of fine pores through which reaction gas is fed into said sealed chamber from the external reaction gas source;
   a lower electrode disposed on the lower side with reaction to said upper electrode and in the sealed chamber, carrying a to-be-processed object, connected to the other of the end terminals of the secondary winding, and supplied with the second high frequency electric power;
   gas pipe means provided penetrating said lower electrode means for introducing a gas medium for facilitating heat transfer between said second electrode means and said to-be-processed object; and
   power splitter means for switching the tap terminals in order to supply to said lower electrode the first high frequency electric power having a level lower than that of the second high frequency electric power,
   wherein the to-be-processed object is processed by means of plasma formed between the first and second electrodes.

7. The plasma apparatus according to claim 6, wherein said power splitter means sets the ratio between the powers supplied to the upper and lower electrodes at 7:3.

8. The plasma apparatus according to claim 6, which further includes means for cooling said lower electrode, an elastic film which is disposed on said lower electrode and on which the object is disposed, and wherein said gas pipe means includes means for introducing the gas medium between the object and said lower electrode.

9. The plasma apparatus according to claim 8, wherein the object to be processed by the plasma generated by a power splitter power supplied between said first and second electrodes within said sealed vacuum is transferred within said sealed chamber through a load lock chamber.

* * * * *

UNITED STATES PATENT AND TRADEMARK OFFICE
CERTIFICATE OF CORRECTION

PATENT NO. : 5,147,493

DATED : September 15, 1992

INVENTOR(S) : Eiichi Nishimura et al.

It is certified that error appears in the above-identified patent and that said Letters Patent is hereby corrected as shown below:

On Title Page:

Item [30], The Foreign Application Priority Data should be as follows:  --Jun. 15, 1990 [JP]  Japan............2-156756--.

Signed and Sealed this

Twenty-first Day of September, 1993

*Attest:*

BRUCE LEHMAN

*Attesting Officer*    *Commissioner of Patents and Trademarks*